(12) United States Patent
Lin (10) Patent No.: US 9,019,741 B2
(45) Date of Patent: Apr. 28, 2015

(54) ONE-TIME PROGRAMMABLE MEMORY CELL, MEMORY AND MANUFACTURING METHOD THEREOF (75) Inventor: Yinyin Lin, Shanghai (CN)

(73) Assignee: Fudan University, Shanghai (CN)

( * ) Notice: Subject to any disclaimer, the term of this patent is extended or adjusted under 35 U.S.C. 154(b) by 287 days.

(21) Appl. No.: 13/809,969

(22) PCT Filed: Jul. 14, 2011

(86) PCT No.: PCT/CN2011/001161
§ 371 (c)(1),
(2), (4) Date: Mar. 5, 2013

(87) PCT Pub. No.: WO2012/006868
PCT Pub. Date: Jan. 19, 2012

(65) Prior Publication Data
US 2013/0163306 A1    Jun. 27, 2013

(30) Foreign Application Priority Data
Jul. 15, 2010    (CN) .......................... 2010 1 0226845

(51) Int. Cl.
| G11C 17/16 | (2006.01) |
| H01L 27/112 | (2006.01) |
| H01L 23/538 | (2006.01) |
| H01L 21/768 | (2006.01) |
| G11C 17/00 | (2006.01) |
| H01L 23/525 | (2006.01) |

(52) U.S. Cl.
CPC ............ *H01L 27/112* (2013.01); *H01L 23/538* (2013.01); *H01L 21/768* (2013.01); *G11C 17/00* (2013.01); *H01L 23/5252* (2013.01); *H01L 27/11206* (2013.01); *H01L 2924/0002* (2013.01)

(58) Field of Classification Search
CPC ........................................................ G11C 7/16
USPC .............. 365/94, 96, 100, 148; 257/529, 530, 257/665, E23.147, E23.149
See application file for complete search history.

(56) References Cited

U.S. PATENT DOCUMENTS

| 7,697,316 B2 * | 4/2010 | Lai et al. ........................ 365/148 |
| 7,812,335 B2 * | 10/2010 | Scheuerlein ...................... 257/4 |
| 7,892,904 B2 | 2/2011 | Fumitake |
| 2004/0108539 A1 | 6/2004 | Kim |
| 2006/0171200 A1 * | 8/2006 | Rinerson et al. ........... 365/185.1 |

FOREIGN PATENT DOCUMENTS

| CN | 101097778 | 1/2008 |
| CN | 101231970 | 1/2012 |

* cited by examiner

*Primary Examiner* — Harry W Byrne
*Assistant Examiner* — Lance Reidlinger
(74) *Attorney, Agent, or Firm* — McDonnell Boehnen Hulbert & Berghoff LLP (57) ABSTRACT

The present invention pertains to the technical field of one-time programmable memory (OTP), and in particular to a one-time programmable memory unit, OTP, and method of fabricating the same. The OTP unit comprises a lower electrode, an upper electrode and a storage medium layer placed between the upper electrode and the lower electrode, the storage medium layer comprises a first metal oxide layer and a second metal oxide layer, wherein an adjoining area for programming is formed between the first metal oxide layer and the second metal oxide layer. The OTP comprises a plurality of the above-described one-time programmable memory units arranged in rows and columns. The OTP unit and the OTP have such characteristics as low programming voltage, small unit area, being able to integrate into a back-end structure of integrated circuit, great process flexibility, and the method of fabricating the OTP unit and the OTP is relatively simple and low in cost.

17 Claims, 8 Drawing Sheets

Fig.1

(Prior Art)

ONE-TIME PROGRAMMABLE MEMORY CELL, MEMORY AND MANUFACTURING METHOD THEREOF

FIELD OF THE INVENTION

The present invention pertains to the technical field of one-time programmable memory (OTP), and in particular relates to a one-time programmable memory unit, OTP, and method of fabricating the same, wherein a storage medium layer is formed using two different layers of metal oxide which are adjacent to each other.

BACKGROUND

Non-volatile memories can still preserve the stored data when power is off, which enables them to be widely used in various types of electronic devices. One-time programmable memory (OTP) is one of the commonly used non-volatile memories, which uses memory units having intersected word lines and bit lines to store logic information, wherein a common memory unit has fuse, anti-fuse, and charge capturing devices (e.g., Floating Gate Avalanche-injection Field Effect Transistor). One-time programmable memory is generally non-repeatedly programmable.

For fuse type of OTP and anti-fuse type of OTP, a high voltage is required to break down insulating layer of capacitor. High power consumption loss will occur during the breakdown. Moreover, since the breakdown voltage is high, the power consumption of OTP is relatively large. Further, with the size of device scaling down proportionally, OTP which is based on oxide layer (i.e., insulating layer) breakdown effect will be subject to the problem of soft breakdown (since the thickness of oxide layer becomes thinner, the probability of occurring soft breakdown is greater).

Figure 1:
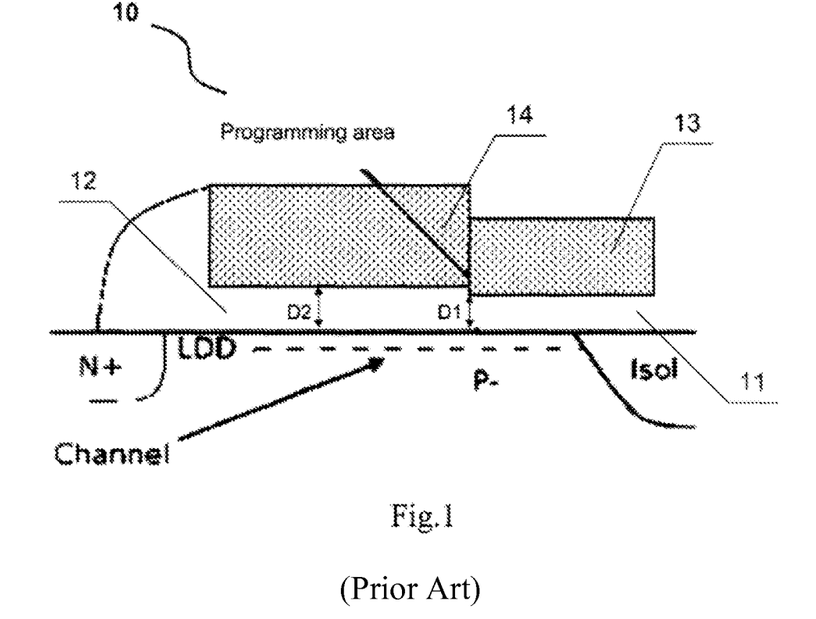
FIG. 1 is a schematic structural view of an OTP unit of the split structure in the prior art.

FIG. 1 shows a schematic structural view of OTP unit of a split structure in the prior art. The OTP unit realizes the programming of OTP through the breakdown of gate oxide dielectric layer formed on a substrate. As shown in FIG. 1, the gate oxide dielectric layer comprises a first gate oxide dielectric layer 11 having a thickness of D1 and a second gate oxide dielectric layer 12 having a thickness of D2, wherein D2 is bigger than D1; each of the first gate oxide dielectric layer 11 and the second gate oxide dielectric layer 12 is formed thereon with a gate electrode, i.e., a gate electrode 13 and a gate electrode 14 respectively. The gate electrode 13 is correspondingly located above the first gate oxide dielectric layer 11, and the gate electrode 14 is correspondingly located above the second gate oxide dielectric layer 12. In this embodiment, the gate electrodes are each made of polysilicon. Since the thickness D1 of the first gate oxide dielectric layer 11 is smaller than the thickness D2 of the second gate oxide dielectric layer 12, when the gate electrodes 13 and 14 are simultaneously biased with a voltage, electric flux-lines are concentrated at an adjoining area of the first gate oxide dielectric layer 11 and the second gate oxide dielectric layer 12, making field intensity increase locally and making this area most vulnerable to breakdown. The adjoining area of the first gate oxide dielectric layer 11 and the second gate oxide dielectric layer 12 is the programming area of the OTP; when be programmed, breakdown points will arise in this area. Therefore, this structure can effectively lower programming voltage of fuse type of OTP and anti-fuse type of OTP.

However, the following problems exist with the OTP unit shown in FIG. 1.

(1) since the OTP is based on gate oxide dielectric layer breakdown and the gate oxide dielectric layer is relatively dense, the breakdown voltage will not be lowered too much; besides, the magnitude of programming voltage mainly depends on the thickness of the gate oxide dielectric layer; therefore, this solution still can not satisfy the requirement of low programming voltage;

(2) the gate oxide dielectric layer is formed above a substrate for forming active elements; therefore, the OTP unit is also formed in a front-end structure, which is typically integrated with the manufacture process of other active devices; thus, the thickness of the gate oxide dielectric layer is constrained by the structural design of other active devices, and the thickness of the gate oxide dielectric layer of OTP can also not designed flexibly.

(3) when a process node below 32 nm is developed for integrated circuit elements, a high-k dielectric will be commonly used instead of gate oxide dielectric layer; the gate oxide dielectric layer of the OTP unit shown in FIG. 1 will also be replaced by a high-k dielectric layer, which will lead to increase of leakage current, thus increasing power consumption of OTP unit.

SUMMARY OF THE INVENTION

The object of the invention is to, in view of the above technical problems, propose an OTP that can be integrated in a back-end structure of integrated circuit and can effectively lower programming voltage.

In order to achieve the above object or other objects, the invention provides the following technical solutions.

According to one aspect of the invention, a one-time programmable memory unit is provided, comprising a lower electrode, an upper electrode and a storage medium layer placed between the upper electrode and the lower electrode, wherein the storage medium layer comprises:

a first metal oxide layer which is formed by oxidizing a first metal layer and/or a first metal compound layer; and a second metal oxide layer which is formed by oxidizing a second metal layer and/or a second metal compound layer;

wherein an adjoining area for programming is formed between the first metal oxide layer and the second metal oxide layer.

According to an embodiment of the one-time programmable memory unit of the invention, wherein the lower electrode is composed of the first metal oxide layer and/or the first metal compound layer and the second metal oxide layer and/or the second metal compound layer.

In the above one-time programmable memory unit, preferably, the thickness of the first metal oxide layer is different from the thickness of the second metal oxide layer.

According to a preferred embodiment of the one-time programmable memory unit of the invention, the one-time programmable memory unit is integrated in a back-end structure of integrated circuit.

In the above one-time programmable memory unit, the back-end structure can be a copper interconnection back-end structure or aluminum interconnection back-end structure.

In the above one-time programmable memory unit, preferably, the one-time programmable memory unit is formed on a copper lead or via of the copper interconnection back-end structure; the first metal layer is a diffusion barrier layer of the copper lead, and the second metal layer is copper metal or copper metal alloy of the copper lead.

In the above one-time programmable memory unit, preferably, the one-time programmable memory unit is formed on a tungsten plug of the copper interconnection back-end structure or the aluminum interconnection back-end structure; the first metal layer is a diffusion barrier layer of the tungsten plug, and the second metal layer is tungsten metal or tungsten metal alloy of the tungsten plug.

Preferably, the diffusion barrier layer is a complex layer of TaN/Ta, TiN/Ti or Ru/TaN; the second metal oxide layer is $Ta_2O_5$, $TiO_x$, or RuO, wherein $1<x\leq3$.

In the above one-time programmable memory unit, preferably, the one-time programmable memory unit is formed on copper leads of different layers of the copper interconnection back-end structure.

In yet another embodiment, the one-time programmable memory unit is formed on a tungsten plug of the aluminum interconnection back-end structure; the first metal layer or the first metal compound layer is the diffusion barrier layer of the tungsten plug, the second metal layer or the second metal compound layer is tungsten metal or tungsten metal alloy of the tungsten plug.

In the above one-time programmable memory unit, preferably, the first metal oxide layer and the second metal oxide layer are substantially located in the same layer.

According to another aspect of the invention, a method for fabricating the above described one-time programmable memory unit is provided, wherein a first metal or a first metal compound layer and a second metal or a second metal compound layer which are located in the same layer are oxidized so that a first metal oxide layer is formed by the partially or totally oxidized the first metal layer or the first metal compound layer and a second metal oxide layer is formed by the partially or totally oxidized the second metal layer or the second metal compound layer;

wherein an adjoining area for programming is formed between the first metal oxide layer and the second metal oxide layer.

According to yet another aspect of the invention, a method for fabricating the above described one-time programmable memory unit is provided, comprising the following steps:

pattern-forming a first metal layer and/or a first metal compound layer and a second metal layer and/or a second metal compound layer;

covering a dielectric layer on the first metal layer and/or the first metal compound layer and the second metal layer and/or the second metal compound layer;

pattern-opening the dielectric layer so as to simultaneously expose the first metal layer and/or the first metal compound layer and the second metal layer and/or the second metal compound layer;

oxidizing the first metal layer and/or the first metal compound layer and the second metal layer and/or the second metal compound layer so as to respectively form a first metal oxide layer and a second metal oxide layer which adjoin with each other; and forming an upper electrode on the first metal oxide layer and the second metal oxide layer.

According to a preferred embodiment of the preparation method of the invention, wherein the method is integrated into a fabricating process of a copper interconnection back-end structure, and the first metal layer and/or the first metal compound layer and the second metal layer and/or the second metal compound layer form a lower electrode of the one-time programmable memory unit.

Preferably, in the oxidizing step, the first metal layer and/or the first metal compound layer and the second metal layer and/or the second metal compound layer are simultaneously oxidized under the same oxidizing conditions.

According to yet another aspect of the invention, a one-time programmable memory is provided, comprising an array of one-time programmable memory units, wherein the array of one-time programmable memory units comprises a plurality of any of the above-described one-time programmable memory units arranged in rows and columns.

According to an embodiment of the one-time programmable memory of the invention, the one-time programmable memory further comprises:

a row decoder connected to the array of one-time programmable memory units;

a column decoder connected to the array of one-time programmable memory units;

an address latch module;

a write drive module;

a sensitive amplifier;

an input/output buffer; and a logic control module.

The technical effects brought about by the invention can be summarized as follows: in the OTP unit provided by the invention, the storage medium layer is composes of two kinds of metal oxides, and the two kinds of metal oxides are formed by oxidizing different layers of metals that adjoin with each other; therefore, the difference between the two kinds of metal oxides will cause the adjoining area to be easily broken down for programming, thus effectively lowering programming voltage. In addition, the metal oxide layers are formed by performing oxidization on the basis of metal or metal compound. The metal oxide layers can be formed in a back-end structure of integrated circuit, which is totally different from conventional OTP in which the storage medium layer is formed in a front-end structure of integrated circuit; therefore, the thicknesses of the first metal oxide layer and the second metal oxide layer which serve as the storage medium layer can be designed flexibly and determined according to oxidizing conditions (e.g., oxidizing duration). Thus, the process shows great flexibility and the unit area can also be designed smaller. Meanwhile, the preparation method is relatively simple to perform and the cost is low.

BRIEF DESCRIPTION OF THE DRAWINGS

The above and other objects and advantages of the invention will become fully understood from the following detailed description with reference to drawings, in which identical or similar elements are denoted by identical reference signs.

DETAILED DESCRIPTION OF THE INVENTION

The invention will be described in more details hereinafter in the exemplary embodiments with reference to the drawings. Some preferred embodiments are provided herein, but it should not be construed that the invention is merely limited to the embodiments illustrated herein. In the drawings, the thicknesses of layers and areas haven been exaggerated for reasons of clarity, but these schematic views should not be construed as strictly reflecting the proportional relationship among geometric sizes.

Figure 2:
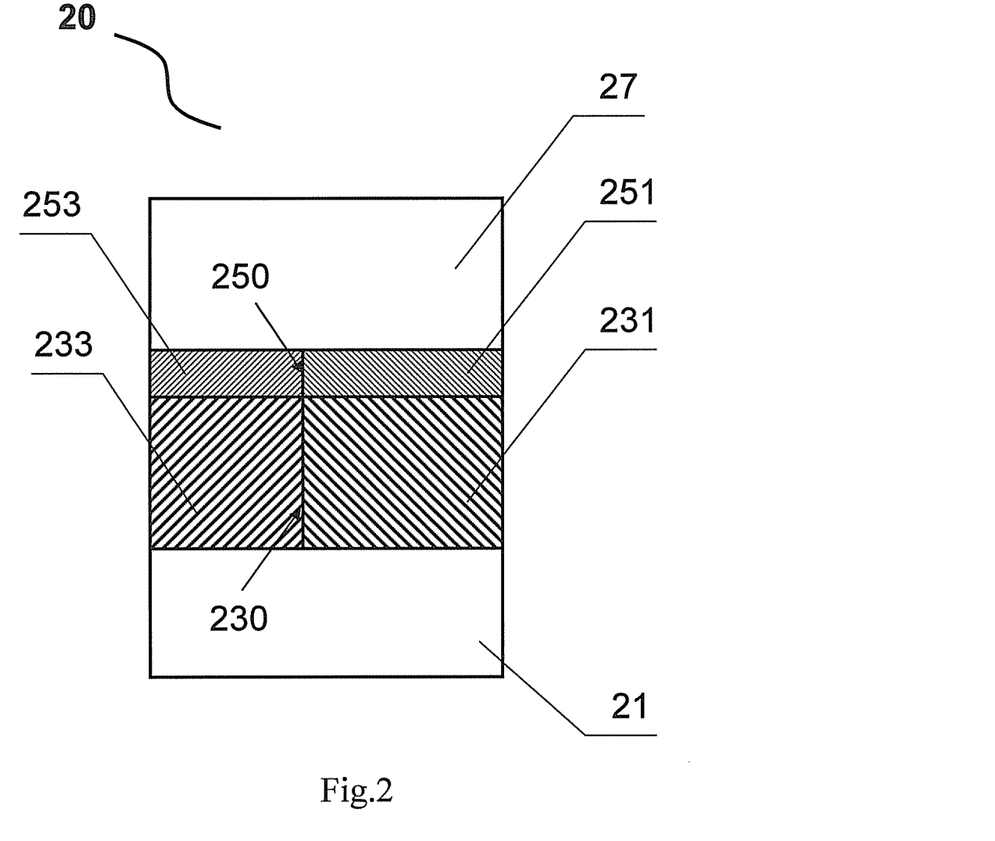
FIG. 2 is a schematic structural view of an OTP unit in accordance with a first embodiment provided by the invention.

The reference views provided herein are schematic views of ideal embodiments of the invention, and the embodiments illustrated in the invention should not be construed as being limited to the particular shape of the area shown in the drawings; rather, the resultant shapes such as the deviation caused by manufacturing are also included. For example, curves that are obtained by dry etching typically have such characteristics as being curved or rounded. However, in the drawings of the embodiments of the invention, all the shapes are represented by rectangles. The representation in the drawings is exemplary and should not be construed as limiting the scope of the invention FIG. 2 is a schematic structural view of an OTP unit in accordance with a first embodiment provided by the invention. In this embodiment, the basic structure of the OTP unit will be described in a simple MIM (metal-insulator-metal) schematic structural view. However, those skilled in the art will appreciate that the OTP unit does not merely comprise the basic structural part shown in FIG. 2. As shown in FIG. 2, the OTP unit 20 also comprises a lower electrode 21 and an upper electrode 27. In this embodiment, a first metal layer 231 and a second metal layer 233 are simultaneously formed on the upper surface of the lower electrode 21. Apparently, the first metal layer 231 and the second metal layer 233 are located in the same layer and adjoin with each other, thus forming the adjoining area 230 shown in the figure. A first metal oxide layer 251 having dielectric characteristic is formed by oxidizing the first metal layer 231, and a second metal oxide layer 253 having dielectric characteristic is formed by oxidizing the second metal layer 233. Therefore, the first metal oxide layer 251 is formed on the first metal layer 231, and the second metal oxide layer 253 is formed on the second metal layer 233. The first metal oxide layer 251 and the second metal oxide layer 253 can be formed by the first metal layer 231 and the second metal layer 233 respectively under the same oxidizing conditions. In this embodiment, the thicknesses of the first metal oxide layer 251 and the second metal oxide layer 253 are substantially the same since it is possible that the rates of oxidizing are substantially the same. The range of thicknesses of the first metal oxide layer 251 and the second metal oxide layer 253 may be 1-20 nm. Due to differences in materials on which oxidization is based (i.e., the first metal layer 231 is different from the second metal layer 233), it is necessary that a relatively apparent joining interface exists in the adjoining area 250 between the first metal oxide layer 251 and the second metal oxide layer 253 that are substantially located in the same layer, that is, the adjoining area 250 is formed. Naturally, the phenomena of lattice dismatch and increased interface states arise in the adjoining area 250. Therefore, when a certain programming voltage is biased across the upper electrode 27 and the lower electrode 21, the adjoining area 250 can be firstly broken down easily under a low voltage, thus realizing a low resistance on-state between the upper electrode 27 and the lower electrode 21. Therefore, the first metal oxide layer 251 and the second metal oxide layer 253 can be used as the storage medium layer of the OTP unit 20, and the adjoining area 250 can be used for programming in form of breakdown and is also the programming area of the storage medium layer.

The upper electrode 27 of the OTP unit is formed above the first metal oxide layer 251 and the second metal oxide layer 253. The upper electrode 27 is made of conductive material, which can be one of Pd, Ta, Ti, TaN, TiN, Cu, Al, Pt, W, Ni, Ru, Ru—Ta alloy, Pt—Ti alloy, and Ni—Ta alloy, or a complex material composed of any two of Pd, Ta, Ti, TaN, TiN, Cu, Al, Pt, W, Ni, Ru, Ru—Ta alloy, Pt—Ti alloy, and Ni—Ta alloy. Moreover, the choosing of the material of upper electrode is not limited by the embodiments of the invention.

In this embodiment, the range of thicknesses of the first metal layer 231 and the second metal layer 233 can be 1-100 nm, but the thicknesses thereof are not limited by the invention. For example, when the first metal layer 231 and the second metal layer 233 are thin, they may be fully oxidized so as to form the first metal oxide layer 251 and the second metal oxide layer 253 respectively, and the OTP unit therefore no longer comprise the first metal layer 231 and the second metal layer 233; in another case, when the first metal layer 231 and the second metal layer 233 are thick, the first metal layer 231 and the second metal layer 233 that remain after the oxidization can simultaneously serves as the lower electrode so as to perform the functions of the lower electrode 21 instead, and the OTP unit may no longer comprise a separate lower electrode 21. In this embodiment, the first metal layer 231 and the second metal layer 233 are formed of two different metal materials and the specific materials thereof are not limited by the embodiments of the invention; therefore, the materials of the first metal oxide layer 251 and the second metal oxide layer 253 are also different and the specific materials thereof are also not limited by the embodiments of the invention. For example, when the first metal layer 231 is made of Ti, the first metal oxide layer 251 formed by oxidization can be $TiO_x$ ($1<x\leq3$); when the second metal layer 233 is made of Ta, the second metal oxide layer 253 formed by oxidization can be $Ta_2O_5$.

It is noted that since a metal compound layer other than metal layer can also be oxidized to form a corresponding metal oxide layer, it is also possible that a first metal compound layer is used to replace the first metal layer and a second metal compound layer is used to replace the second metal layer, as long as the first metal compound layer is different from the second metal compound layer in terms of material thereof. For example, the metal compound TiN is used to replace the first metal layer 231 of Ti, and the metal compound TaN is used to replace the second metal layer 233 of Ta. Similarly, the specific materials of the first metal compound layer and the second metal compound layer are not limited by the embodiments of the invention, and the specific thicknesses of the first metal compound layer and the second metal compound layer are also not limiting, as long as the their thicknesses are substantially the same.

It is further noted that one of the first metal layer and the second metal layer may also be selected to be replaced by a metal compound layer. For example, when the first metal layer 231 is made of Ti, the second metal layer 233 of Ta can be replaced by a second metal compound layer of TaN. Of course, the second metal layer 233 of Ta can also be replaced by TiN. In this particular embodiment, the metal oxides respectively formed by simultaneously oxidizing Ti and TiN are different, and the adjoining area between the two oxides would also be easily broken down to perform programming.

Therefore, the "difference" between the first metal oxide layer 251 and the second metal oxide layer 253 not only refers to the difference between the metal elements to be oxidized, but also refers to the difference in material structure between the metal oxides. The structure difference between the two metal oxides may also cause the adjoining area thereof to be easily broken down for reasons of lattice dismatch and increased interface states, etc.

Therefore, in the OTP unit of the embodiment shown in FIG. 2, the storage medium layer is formed on the basis of two metal oxides, and the difference in the two metal oxides causes the adjoining area to be easily broken down for programming, thus effectively lowering the programming voltage thereof. Besides, the metal oxide layers are formed by oxidizing metal or metal compound and can be formed in a back-end structure of integrated circuit, which is totally different from a conventional OTP in which the storage medium layer is formed in a front-end structure of integrated circuit. Therefore, the thicknesses of the first metal oxide layer and the second metal oxide layer used as the storage layers can be flexibly designed and determined according to oxidizing conditions (e.g., oxidizing duration) or oxidizing methods, thus exhibiting great process flexibility.

Figure 3:
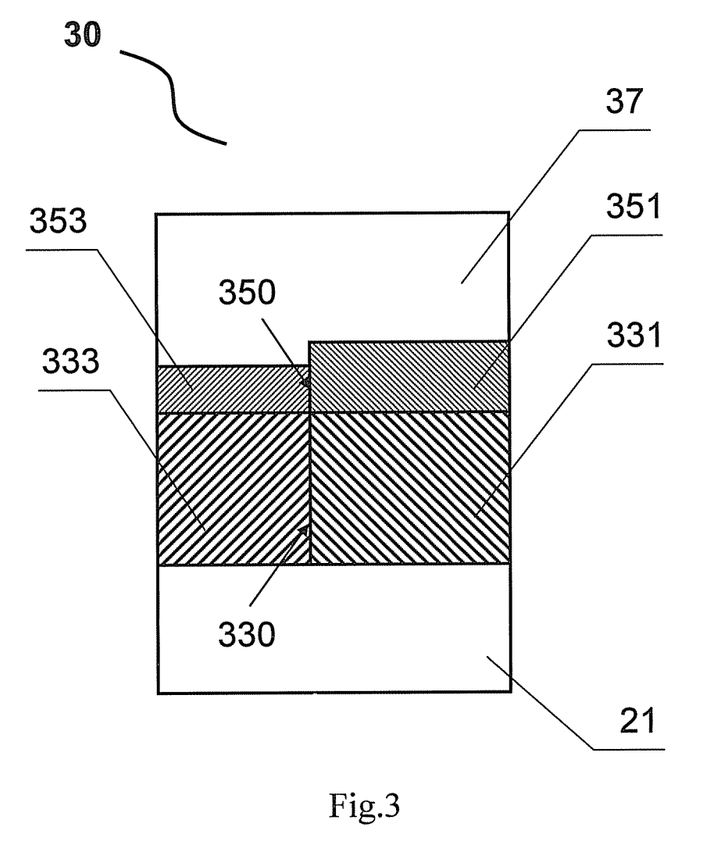
FIG. 3 is a schematic structural view of an OTP unit in accordance with a second embodiment provided by the invention.

FIG. 3 is a schematic structural view of an OTP unit in accordance with a second embodiment provided by the invention. Similarly, the OTP unit 30 comprises a lower electrode 21, a first metal layer 331, a second metal layer 333, a first metal oxide layer 351, a second metal oxide layer 353 and an upper electrode 37. An adjoining area 330 exists between the first metal layer 331 and the second metal layer 333, and an adjoining area 350 exists between the first metal oxide layer 351 and the second metal oxide layer 353. The main difference from the OTP unit 20 shown in FIG. 2 lies in that the thicknesses of the first metal oxide layer 351 and the second metal oxide layer 353 that are substantially located in the same layer are different. For example, in this embodiment, the thickness of the second metal oxide layer 353 is smaller than that of the first metal oxide layer 351, and the specific range of thickness difference can be 2-20 nm, e.g., 5 nm, which is not limiting. This is because the materials of the first metal oxide layer 351 and the second metal oxide layer 353 are different, which may lead to different rates of oxidization under the same oxidizing conditions, thus making the thicknesses of the formed metal oxide layers also different. If the rate of oxidization of the second metal layer 333 is larger than that of the first metal layer 331, the thickness of the second metal oxide layer 353 can be bigger than that of the first metal oxide layer 351. In the event that the thicknesses of the first metal oxide layer 351 and the second metal oxide layer 353 are different, electric flux-lines will concentrate around the contact point between the adjoining area 350 of the first metal oxide layer 351 and the second metal oxide layer 353 and the upper electrode, making field intensity increase locally and making the OTP unit 30 more easily to be broken down. Therefore, as compared to the OTP unit 20 shown in FIG. 2, the OTP unit 30 can be more easily broken down so that the programming voltage can be lowered. The other parts of the OTP unit 30 are substantially the same as those of the OTP unit 20 shown in FIG. 2, and are thus not discussed in details herein.

Figure 4:
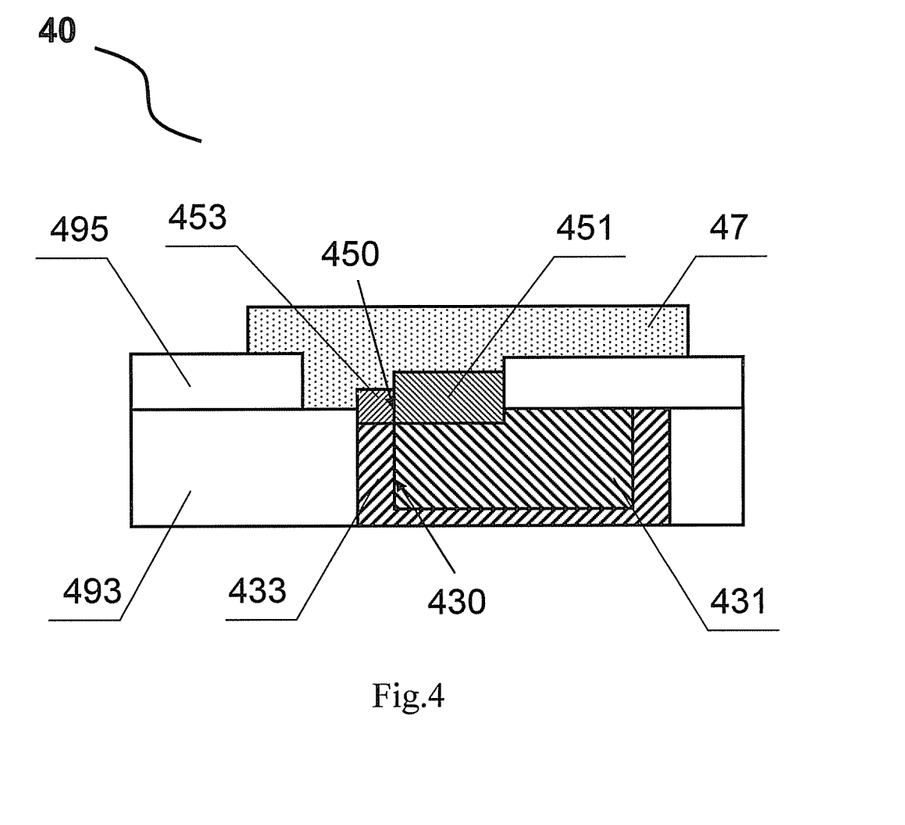
FIG. 4 is a schematic structural view of an OTP unit in accordance with a third embodiment provided by the invention.

FIG. 4 is a schematic structural view of an OTP unit in accordance with a third embodiment provided by the invention. Just as described previously, since the OTP unit of the invention is based on metal oxides, it can be formed in a back-end structure of integrated circuit, and the OTP unit 40 of the embodiment shown in FIG. 4 is an OTP unit integrated in the back-end structure. As shown in FIG. 4, the OTP unit 40 also comprises a first metal layer 431, a second metal layer 433, a first metal oxide layer 451, a second metal oxide layer 453, and an upper electrode 47. An adjoining area 430 exists between the first metal layer 431 and the second metal layer 433, and an adjoining area 450 exists between the first metal oxide layer 451 and the second metal oxide layer 453. In this embodiment, the first metal layer 431 and the second metal layer 433 are lead wires in the back-end structure, and the first metal layer 431 and the second metal layer 433 also serve as the lower electrode of the OTP unit 40. Since the lead wires are typically composed of different components in the interconnection structure, e.g., for a copper lead, it is typically composed of a diffusion barrier layer and copper metal (or copper metal alloy), and for tungsten plug, it is typically composed of a diffusion barrier layer and tungsten metal (or tungsten metal alloy), the lead wires can be herein used as the first metal layer 431 and the second metal layer 433 (the second metal layer 433 may also be a metal compound layer). The OTP unit 40 further comprises a first dielectric layer 493 for pattern-forming the first metal layer 431 and the second metal layer 433 and a second dielectric layer 495 for pattern-forming the first metal oxide layer 451 and the second metal oxide layer 453. By providing a hole in the second dielectric layer 495 so as to partly expose the first metal layer 431 and the second metal layer 433 simultaneously, it is advantageous to form the first metal oxide layer 451 and the second metal oxide layer 453 by oxidizing under the same conditions. The upper electrode 47 can be metal in a via of the interconnection structure, or it can be also formed separately. For example, the upper electrode 47 can be formed by firstly depositing metal in holes in the second dielectric layer 495 and then performing CMP process steps thereon.

Specifically, when the OTP unit 40 is formed on copper leads of the copper interconnection back-end structure, the first metal layer 431 is copper metal or copper metal alloy for forming copper leads, which can be formed by electro-plating; the second metal layer 433 is the diffusion barrier layer, which typically serves for preventing copper metal from being diffused towards the first dielectric layer 493 and can be specifically made of a complex materials such as TaN/Ta, TiN/Ti, Ru/TaN. When the diffusion barrier layer and the copper metal are oxidized under the same oxidizing conditions, the second metal oxide layer 453 and the first metal oxide layer 451 are formed respectively by oxidization. In this embodiment, the thickness of the second metal oxide layer 453 and the first metal oxide layer 451 are different due to difference in oxidizing rate. For example, the second metal oxide layer 453 formed by oxidizing the diffusion barrier layer can be $Ta_2O_5$, $TiO_x$ ($1<x\leq3$), RuO, etc, or it can be a mixture of the above oxide materials, which may have a thickness of 5 nm, for example; the first metal oxide layer formed by oxidizing copper metal can be $Cu_xO$ ($1<x\leq2$), which may has a thickness of 8 nm, for example. Therefore, the adjoining area 450 between the first metal oxide layer and the second metal oxide layer can be easily broken down so that the programming voltage is effectively lowered; the OTP unit 40 can be integrated in a copper interconnection back-end structure. The preparation process of the OTP unit is also substantially compatible with the preparation process of copper interconnection back-end. Therefore, the preparation cost of the OTP unit is also lowered. Meanwhile, the OTP unit 40 can also be formed on copper leads of different layers, which makes it easy to realize a three-dimensional stack manufacture of the OTP unit and is advantageous for realizing high density arrangement.

In addition, when the OTP unit 40 is formed on copper leads of the copper interconnection back-end structure, the first dielectric layer 493 is an interconnection dielectric layer and the second dielectric layer 495 is a cap layer.

Specifically, the OTP unit 40 can also be formed on a tungsten plug of the copper interconnection back-end structure. In this case, the first metal layer 431 is made of tungsten metal, which could be tungsten metal formed by sputtering; the second metal layer 433 is the diffusion barrier layer, which typically serves for enhancing adhesion between the tungsten metal and the first dielectric layer 493 and can be specifically made of a complex material such as TaN/Ta, TiN/Ti, Ru/TaN. When the OTP unit 40 is formed on the tungsten plug of the copper interconnection back-end structure, the first dielectric layer 493 is a PMD layer, and the second dielectric layer 495 is a cap layer. Similarly, when the diffusion barrier layer and the tungsten metal are oxidized under the same oxidizing conditions, the second metal oxide layer 453 and the first metal oxide layer 451 are formed respectively by oxidization.

Specifically, the OTP unit can also be formed in a via of the copper interconnection back-end structure, wherein the first metal layer 431 is copper metal for forming the via and could be copper metal formed by electroplating, and the second metal layer 433 is a diffusion barrier layer which typically serves for preventing copper metal diffusing towards the first dielectric layer 493 and can be specifically a complex material such as TaN/Ta, TiN/Ti, Ru/TaN. Similarly, when the diffusion barrier layer and the copper metal are oxidized under the same oxidizing conditions, the second metal oxide layer 453 and the first metal oxide layer 451 are formed respectively by oxidization.

Specifically, the OTP unit 40 can also be formed on a tungsten plug of a aluminum interconnection back-end structure. Various specific examples are not listed in detail herein. Those skilled in the art, upon appreciating the idea and spirit of the invention, will possibly take the advantage of the characteristics in terms of difference between two metal materials in various interconnection structures to form the first metal oxide layer and the second metal oxide layer respectively by oxidization.

Figure 5:
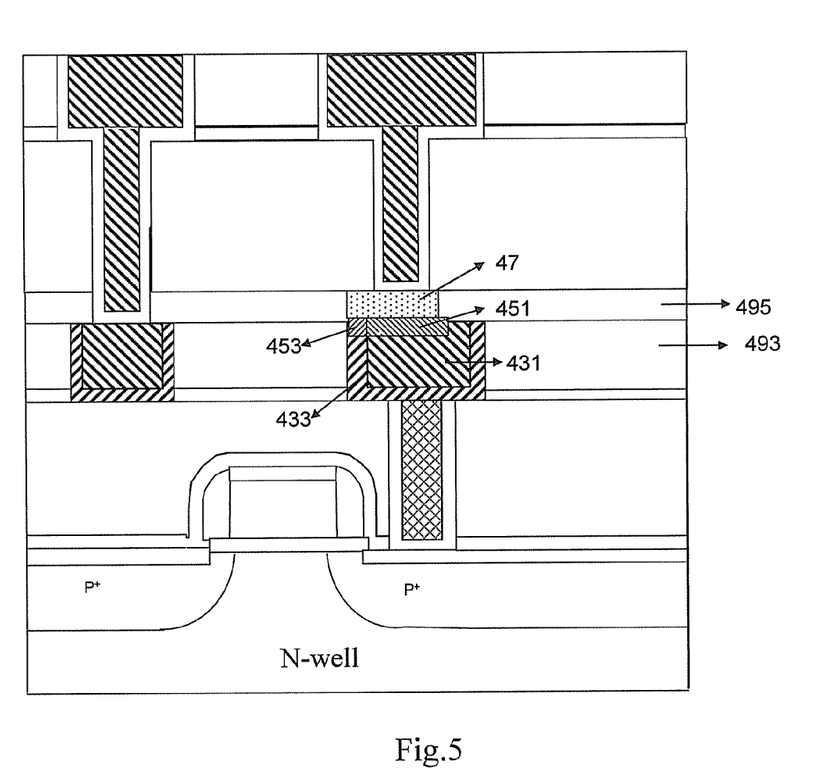
FIG. 5 is a schematic structural view showing the OTP unit of the embodiment shown in FIG. 4 of the invention being integrated onto a copper lead of a copper interconnection back-end structure.

FIG. 5 is a schematic structural view showing the OTP unit of the embodiment shown in FIG. 4 of the invention being integrated onto a copper lead of a copper interconnection back-end structure. As shown in FIG. 5, it is schematically shown that the OTP unit 40 is integrated onto a first layer of copper lead, and the metal oxide layers 453 and 451 which serve as storage medium are formed by oxidizing a diffusion barrier layer 433 and a copper metal layer 431 of the first layer of copper lead simultaneously. Similarly, the adjoining area 450 between the metal oxide layers 453 and 451 is the programming area. It is noted that FIG. 5 schematically shows the case in which part of the copper leads have the OTP unit formed thereon and part of the copper leads do not have the OTP unit formed thereon.

Figure 6:
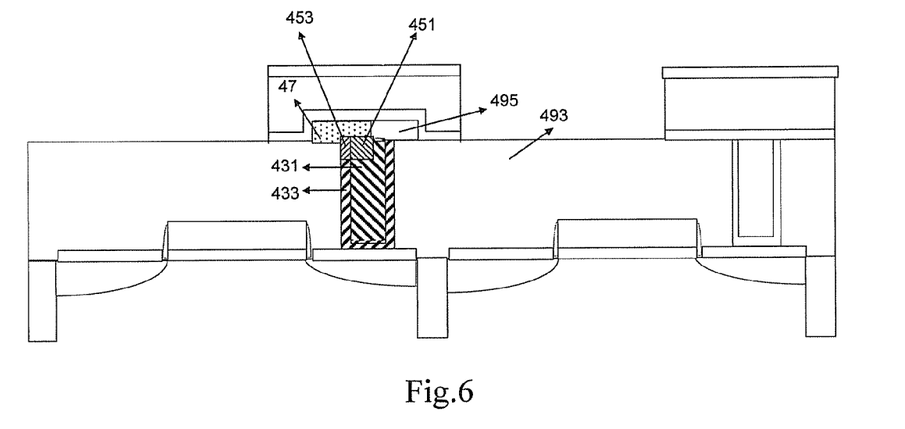
FIG. 6 is a schematic structural view showing the OTP unit of the embodiment shown in FIG. 4 of the invention being integrated in a tungsten plug of an aluminum interconnection back-end structure.

FIG. 6 is a schematic structural view showing the OTP unit of the embodiment shown in FIG. 4 of the invention being integrated in a tungsten plug of an aluminum interconnection back-end structure. As shown in FIG. 6, it is schematically shown that the OTP unit 40 is integrated above a tungsten plug and under a first layer of aluminum lead, and the metal oxide layers 451 and 453 which serve as storage medium are formed by oxidizing the diffusion barrier layer 433 and the tungsten metal layer 431 of the tungsten plug simultaneously. Similarly, the adjoining area 450 between the metal oxide layers 451 and 453 is the programming area. It is noted that FIG. 6 schematically shows the case in which part of the tungsten plug has the OTP unit formed thereon and part of the tungsten plug has not the OTP unit formed thereon.

The method of fabricating the OTP unit of the invention will be described hereinafter. In the following embodiment, description will be given to the method of fabricating the OTP unit of the embodiment shown in FIG. 4.

FIGS. 7-10 are schematic structural views showing variation during the method process of fabricating the OTP unit shown in FIG. 4. The basic process of fabricating the OTP unit 40 will be described with reference to FIGS. 7-10 in an example in which the OTP unit 40 is integrated onto copper lead of a copper interconnection back-end structure.

Step 1: pattern-forming a certain layer of copper lead of the copper interconnection back-end structure.

Figure 7:
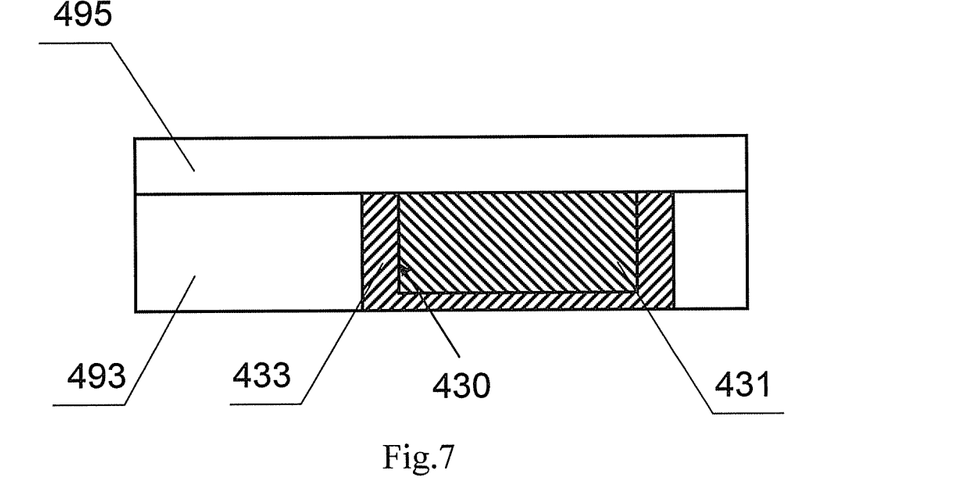
FIGS. 7-10 are schematic structural views showing variation during the method process of fabricating the OTP unit shown in FIG. 4.

In this step, as shown in FIG. 7, the copper lead is already formed after CMP process and depositing a cap layer 495 (i.e., a second dielectric layer). It is noted that in this embodiment, only a partial schematic view of the copper interconnection back-end structure is schematically shown. Specifically, the layer at which the copper lead is located is not limiting. The diffusion barrier layer of the copper lead is the second metal layer 433, the copper metal layer is the first metal layer 431, and the copper lead simultaneous functions as the lower electrode of the OTP unit. Therefore, it can be understood that the lower electrode of the OTP unit is formed in this step.

Further, in step 2, the cap layer on the copper lead is pattern-opened so as to expose the first metal layer and the second metal layer simultaneously. Specifically, the first metal layer 431 and the second metal layer 433 can be partially exposed, or the first metal layer 431 and the second metal layer 433 can also be fully exposed. In this embodiment, the first metal layer 431 and the second metal layer 433 are partially exposed.

Figure 8:
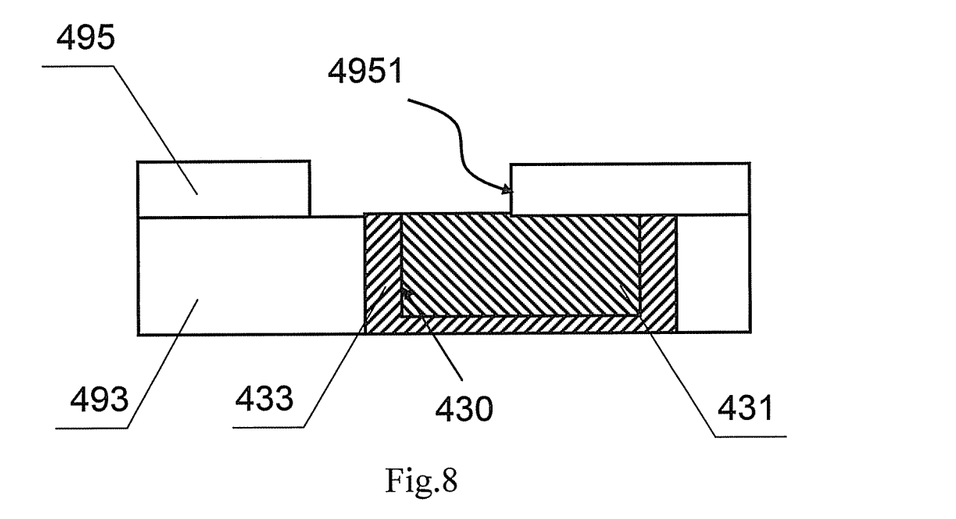

In this step, as shown in FIG. 8, the cap layer 495 is etched by performing patterning through lithography process. A hole 4951 is formed in the cap layer 495 by etching the cap layer 495, which exposes part of the first metal layer 431 and the second metal layer 433 so as to get prepare for oxidizing the first metal layer 431 and the second metal layer 433 simultaneously. In this step, the size and shape of the hole 4951 can be designed to determine the size and shape of the OTP unit. In this embodiment, the hole 4951 exposes the left partial area of the copper lead shown in FIG. 8, but this is not limiting. It is also possible that the left and right areas of the copper lead shown in FIG. 8 are simultaneously exposed, as long as the first metal layer 431 and the second metal layer 433 are exposed simultaneously.

Further, in step 3, the first metal layer and the second metal layer are simultaneously oxidized to form the first metal oxide layer and the second metal oxide layer.

Figure 9:
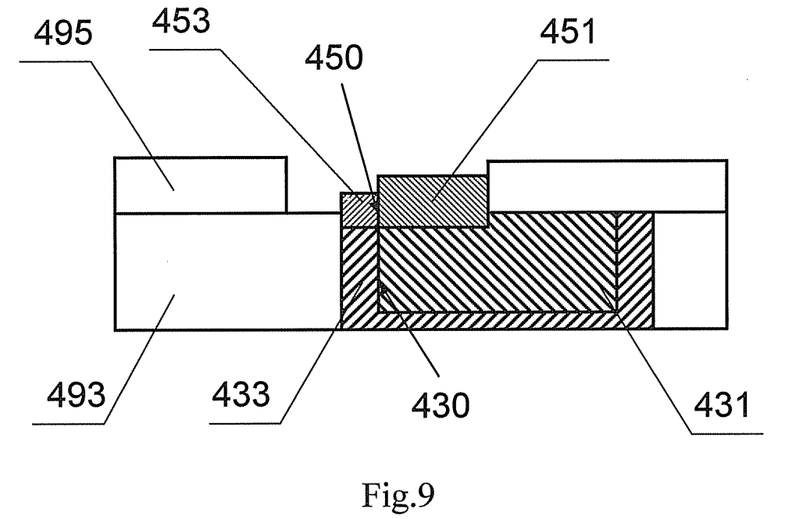

In this step, as shown in FIG. 9, the diffusion barrier layer (the second metal layer 433) and the copper metal layer (the first metal layer 431) in the copper lead are oxidized under the same oxidizing conditions. In this embodiment, the same oxidizing conditions can be heating oxidization, plasma oxidization for example, but the specific oxidizing conditions are not limiting. Those skilled in the art can select oxidizing conditions according to such factors as material properties of the first and second metal layers and the thicknesses of oxide layers to be formed. In this embodiment, the formed first metal oxide layer 451 and the formed second metal oxide layer 453 are $Cu_xO$ ($1<x\leq2$) and $TaO_x/TaON$ ($1<x\leq3$) respectively, and the adjoining area 450 between the first metal oxide layer 451 and the second metal oxide layer 453 is the programming area. The thickness of the first metal oxide layer 451 or the second metal oxide layer 453 needs to be smaller than that of the cap layer as much as possible so that the hole can also be filled with metal material to form the upper electrode.

Further, in step 4, an upper electrode is formed by patterning.

Figure 10:
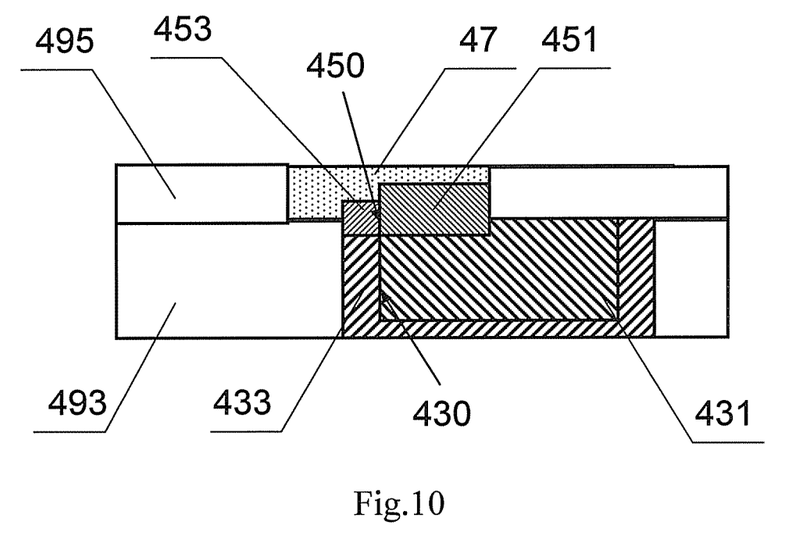

In this step, as shown in FIG. 10, a metal material of the upper electrode is deposited and then planarizatation by CMP so that an upper electrode 47 is formed in the hole 4951. Alternatively, the upper electrode 47 can also be formed by lithography process.

The OTP unit shown in FIG. 4 is formed hereto. Other processes of the copper interconnection back-end can proceed after the OTP unit is formed on the copper lead.

The invention further provides an OTP memory comprising the above-described OTP units.

Figure 11:
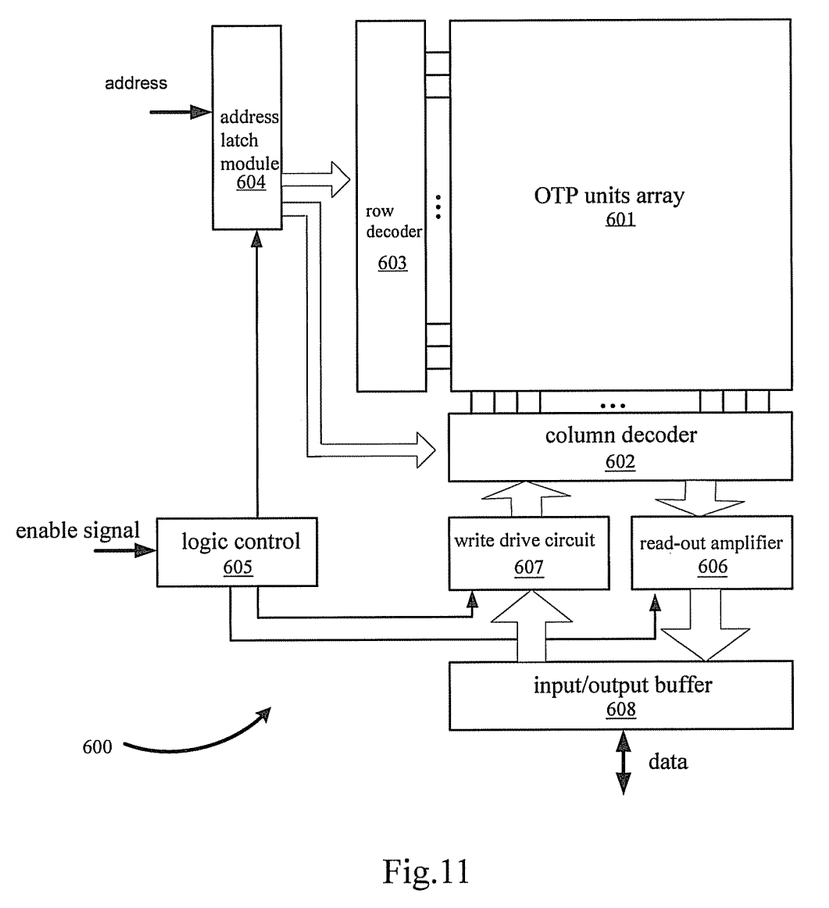
FIG. 11 is a schematic structural view in accordance with an embodiment of the OTP provided by the invention.

FIG. 11 is a schematic structural view in accordance with an embodiment of the OTP provided by the invention. FIG. 11 merely schematically shows main components of the OTP, and the OTP may further comprise many known elements such as a sensitive amplifier, a row decoder, a column decoder, etc. As shown in FIG. 11, the OTP 600 comprises an OTP units array 601, a column decoder 602, a row decoder 603, an address latch module 604, a logic control 605, a read-out amplifier 606, a write drive circuit 607 and an input/output buffer 608; wherein the OTP units array (i.e., the array of OTP units) 601 is formed by a plurality of the above-described OTP units arranged in rows and columns. Each OTP unit is formed at the intersecting point of a word line and a bit line. For example, the lower electrode of the OTP unit is connected with a word line, and the upper electrode of the OTP unit is connected with a bit line. Of course, it is also possible that the lower electrode of the OTP unit is connected with a bit line, and the upper electrode of the OTP unit is connected with a word line.

When reading and writing operations are being performed on the OTP 600, address signals input from outside is latched in the address latch module 604, wherein a row address signal in input to the row decoder 603 connected with the address latch module 604, and a column address signal in input to the column decoder 602 connected with the address latch module 604, and the outputs of the column decoder 602 and the row decoder 603 respectively selects a corresponding row and a corresponding column of the OTP units array 601. When a writing operation is being performed on the memory, an external data signal is input to the write drive circuit 607 through the input/output buffer 608, and the write drive circuit 607 generates a corresponding write voltage or write current (i.e., the programming electrical signal shown in FIG. 2) in the OTP units array 601 according to the input data so as to perform the write operation (i.e., reset operation); when a read-out operation is being performed, the sensitive amplifier 606 applies a certain read signal to the OTP units array 601 and reads out a corresponding data signal according to different states of the memory units, and the data is then output to the outside through the input/output buffer 608. The control logic 605 controls the time sequence of the column decoder 602, the row decoder 603, the address latch module 604, the sensitive amplifier 606, the write drive circuit 607 and the input/output buffer 608, so that the whole memory 600 functions normally. It is noted that the memory 600 is merely exemplary, since many other technologies that are known to those skilled in the art can be used as necessary so as to perform addressing operation on the memory array, input data to the memory array or output data from the memory array, and provide various operating voltages required by the memory array, etc.

The above examples mainly discuss the OTP unit of the invention, method of fabricating the same as well as the OTP. While only some of the embodiments of the invention have been described, it is understood by those skilled in the art that the invention can be implemented in many other forms without departing from the spirit and scope thereof. Therefore, the illustrated examples and embodiments should be construed as exemplary rather than limiting. The invention may cover various modifications and replacements without departing from the spirit and scope of the invention as defined by appended claims.

The invention claimed is:

1. A one-time programmable memory unit, comprising a lower electrode, an upper electrode and a storage medium layer placed between the upper electrode and the lower electrode, characterized in that the storage medium layer comprises:
   a first metal oxide layer which is formed by oxidizing a first metal layer or a first metal compound layer; and
   a second metal oxide layer which is formed by oxidizing a second metal layer or a second metal compound layer;
   wherein the first metal layer or the first metal compound layer and the second metal layer or the second metal compound layer are substantially located in the same layer and adjoin with each other, and the lower electrode is composed of the first metal oxide layer or the first metal compound layer and the second metal oxide layer or the second metal compound layer; an adjoining area for programming is formed between the first metal oxide layer and the second metal oxide layer.

2. A one-time programmable memory unit according to claim 1, characterized in that the thickness of the first metal oxide layer is different from the thickness of the second metal oxide layer.

3. A one-time programmable memory unit according to claim 1, characterized in that the one-time programmable memory unit is integrated in a back-end structure of integrated circuit.

4. A one-time programmable memory unit according to claim 3, characterized in that the back-end structure is a copper interconnection back-end structure or aluminum interconnection back-end structure.

5. A one-time programmable memory unit according to claim 4, characterized in that the one-time programmable memory unit is formed on a copper lead or via of the copper interconnection back-end structure; the first metal layer or the first metal compound layer is a diffusion barrier layer of the copper lead, and the second metal layer or the second metal compound layer is copper metal or copper metal alloy of the copper lead.

6. A one-time programmable memory unit according to claim 5, characterized in that the diffusion barrier layer is a complex layer of TaN/Ta, TiN/Ti or Ru/TaN; the second metal oxide layer is $Ta_2O_5$, TiOx or RuO, wherein $1<x\leq3$.

7. A one-time programmable memory unit according to claim 5, characterized in that the one-time programmable memory unit is formed on copper leads of different layers of the copper interconnection back-end structure.

8. A one-time programmable memory unit according to claim 4, characterized in that the one-time programmable memory unit is formed on a tungsten plug of the copper interconnection back-end structure or the aluminum interconnection back-end structure; the first metal layer or the first metal compound layer is a diffusion barrier layer of the tungsten plug, and the second metal layer or the second metal compound layer is tungsten metal or tungsten metal alloy of the tungsten plug.

9. A one-time programmable memory unit according to claim 8, characterized in that the diffusion barrier layer is a complex layer of TaN/Ta, TiN/Ti or Ru/TaN; the second metal oxide layer is $Ta_2O_5$, TiOx or RuO, wherein $1<x>3$.

10. A one-time programmable memory unit according to claim 4, characterized in that the one-time programmable memory unit is formed on a tungsten plug of the aluminum interconnection back-end structure; the first metal layer or the first metal compound layer is the diffusion barrier layer of the tungsten plug, the second metal layer or the second metal compound layer is tungsten metal or tungsten metal alloy of the tungsten plug.

11. A one-time programmable memory unit according to claim 1, characterized in that the first metal oxide layer and the second metal oxide layer are substantially located in the same layer.

12. A one-time programmable memory, characterized by comprising an array of one-time programmable memory units, and the array of one-time programmable memory units comprises a plurality of one-time programmable memory units according to claim 1 which are arranged in rows and columns.

13. A one-time programmable memory according to claim 12, characterized by further comprising:
- a row decoder connected to the array of one-time programmable memory units;
- a column decoder connected to the array of one-time programmable memory units;
- an address latch module;
- a write drive module;
- a sensitive amplifier;
- an input/output buffer; and
- a logic control module.

14. A method for fabricating the one-time programmable memory unit according to claim 1, characterized in that a first metal or a first metal compound layer and a second metal or a second metal compound layer which are substantially located in the same layer and adjoin with each other are oxidized so that a first metal oxide layer is formed by the partially or totally oxidized the first metal layer or the first metal compound layer and a second metal oxide layer is formed by the partially or totally oxidized the second metal layer or the second metal compound layer;

wherein an adjoining area for programming is formed between the first metal oxide layer and the second metal oxide layer;

wherein the first metal oxide layer or the first metal compound layer and the second metal oxide layer or the second metal compound layer compose a lower electrode of the one-time programmable memory unit.

15. A method for fabricating the one-time programmable memory unit according to claim 1, characterized by comprising the following steps:
- pattern-forming a first metal layer or a first metal compound layer and a second metal layer or a second metal compound layer;
- covering a dielectric layer on the first metal layer or the first metal compound layer and the second metal layer or the second metal compound layer;
- pattern-opening the dielectric layer so as to simultaneously expose the first metal layer or the first metal compound layer and the second metal layer or the second metal compound layer;
- oxidizing the first metal layer or the first metal compound layer and the second metal layer or the second metal compound layer so as to respectively form a first metal oxide layer and a second metal oxide layer which adjoin with each other; and
- forming an upper electrode on the first metal oxide layer and the second metal oxide layer;

wherein the first metal oxide layer or the first metal compound layer and the second metal oxide layer or the second metal compound layer, composing a lower electrode of the one-time programmable memory unit, are substantially located in the same layer and adjoin with each other.

16. The method according to claim 15, characterized in that the method is integrated into a fabricating process of a copper interconnection back-end structure, and the first metal layer or the first metal compound layer and the second metal layer or the second metal compound layer form a lower electrode of the one-time programmable memory unit.

17. The method according to claim 15, characterized in that in the oxidizing step, the first metal layer or the first metal compound layer and the second metal layer or the second metal compound layer are simultaneously oxidized under the same oxidizing conditions.

* * * * *